(12) United States Patent
Ogihara et al.

(10) Patent No.: US 8,524,366 B2
(45) Date of Patent: Sep. 3, 2013

(54) GRAPHENE WAFER, METHOD FOR MANUFACTURING THE GRAPHENE WAFER, METHOD FOR RELEASING A GRAPHENE LAYER, AND METHOD FOR MANUFACTURING A GRAPHENE DEVICE

(75) Inventors: Mitsuhiko Ogihara, Gunma (JP);
Tomohiko Sagimori, Gunma (JP);
Masaaki Sakuta, Tokyo (JP); Akihiro Hashimoto, Fukui (JP); Satoru Tanaka, Fukuoka (JP)

(73) Assignee: Oki Data Corporation, Tokyo (JP)

( * ) Notice: Subject to any disclaimer, the term of this patent is extended or adjusted under 35 U.S.C. 154(b) by 402 days.

(21) Appl. No.: 12/801,720

(22) Filed: Jun. 22, 2010

(65) Prior Publication Data
US 2010/0323164 A1 Dec. 23, 2010

(30) Foreign Application Priority Data
Jun. 23, 2009 (JP) .................................. 2009-148308

(51) Int. Cl.
*B32B 9/00* (2006.01)
(52) U.S. Cl.
USPC .......................................... 428/408; 423/448
(58) Field of Classification Search
USPC .................... 428/408; 423/447.1, 447.2, 448
See application file for complete search history.

(56) References Cited

U.S. PATENT DOCUMENTS

| 4,358,046 A | * | 11/1982 | Detz et al. ..................... 228/176 |
| 2007/0102111 A1 | * | 5/2007 | Monsma et al. ............... 156/296 |
| 2009/0079040 A1 | | 3/2009 | Schultz et al. |

FOREIGN PATENT DOCUMENTS

| JP | 2008-205272 | 9/2008 |
| JP | 2009-062247 A | 3/2009 |
| JP | 2009-200177 | 9/2009 |

OTHER PUBLICATIONS

Reina et al.: "Transferring and Identification of Single- and Few-Layer Graphene on Arbitrary Substrates", American Chemical Society, US, Journal of Physical Chemistry Part C, vol. 112, No. 46, XP 002553259, Oct. 24, 2008, pp. 17741-17744.
Hines et al.: "Transfer Printing as a Method for Fabricating Hybrid Devices on Flexible Substrates", The International Society for Optical Engineering SPIE, USA, vol. 6658, XP009152610, Sep. 13, 2007, pp. 66580Y-1 through 66580Y-11.
Sidorov et al.: "Electrostatic deposition of grapheme", IOP Publishing Ltd., Nanotechnology, Bristol, GB, vol. 18, No. 13, XP020118952, Apr. 4, 2007, p. 135301.

* cited by examiner

*Primary Examiner* — Maria Veronica Ewald
*Assistant Examiner* — Daniel H Miller
(74) *Attorney, Agent, or Firm* — Rabin & Berdo, P.C.

(57) ABSTRACT

A method is used for releasing a graphene layer from a substrate. A graphene layer is first formed on a surface of a first substrate. A metal layer is then formed on a surface of the graphene layer. A pulling force is then applied to the metal layer to detach the graphene layer from the first substrate. The released graphene layer is bonded by intermolecular force onto a surface of a second substrate separate from the first substrate or onto a surface of a bonding layer formed on the surface of the second substrate. The metal layer is then removed, by for example, etching.

11 Claims, 13 Drawing Sheets

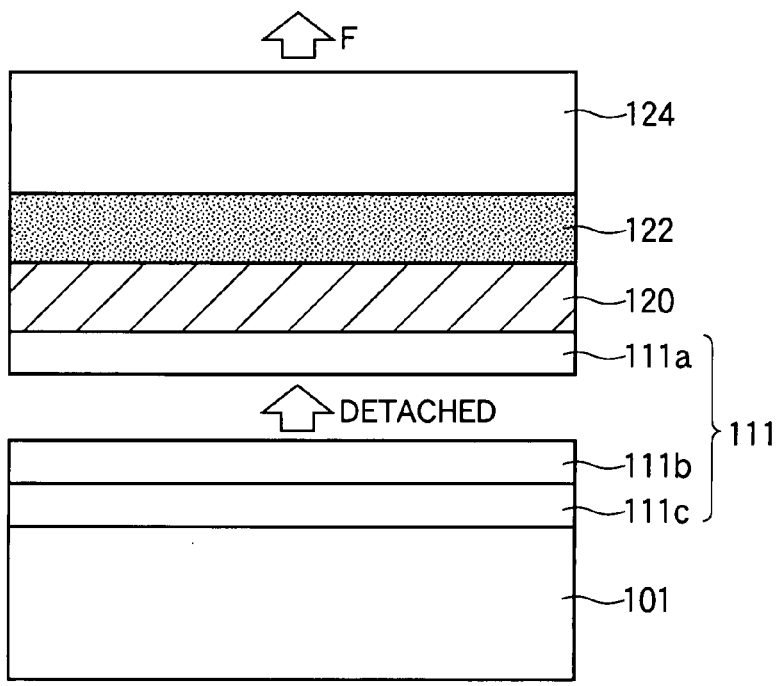
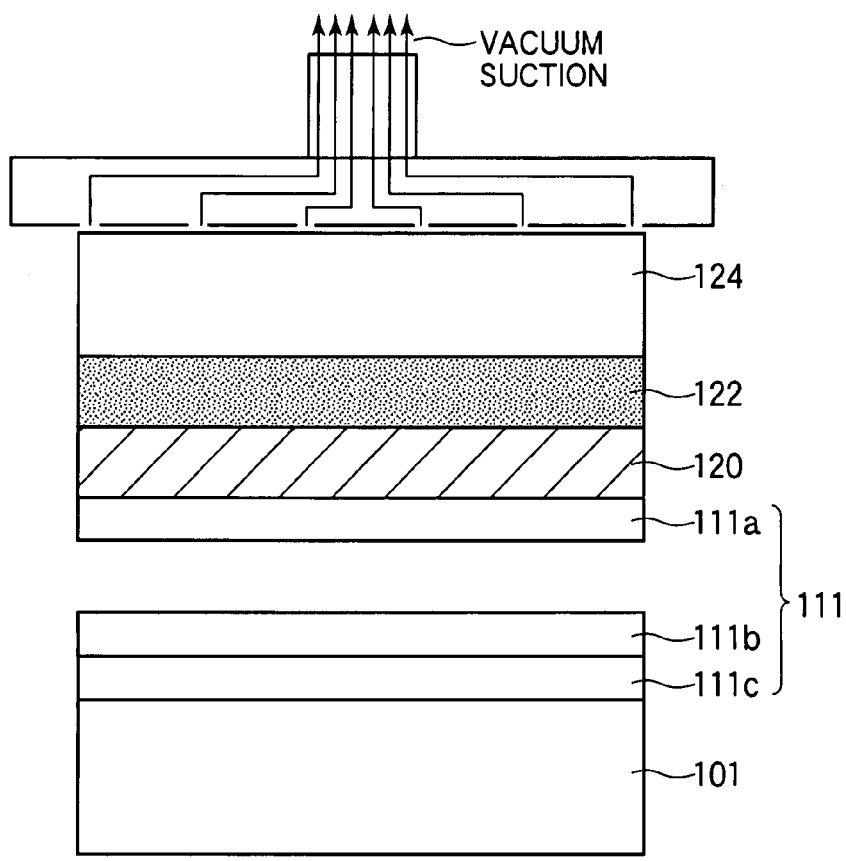

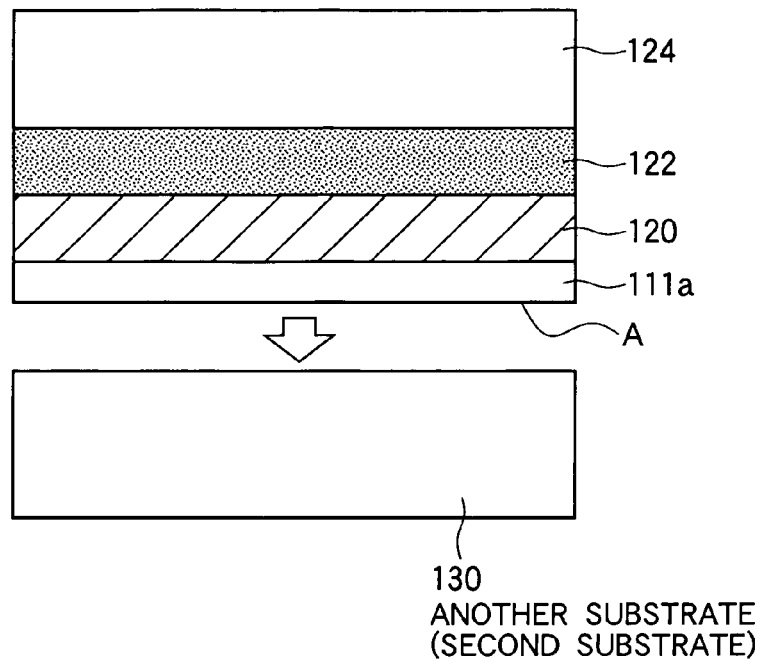
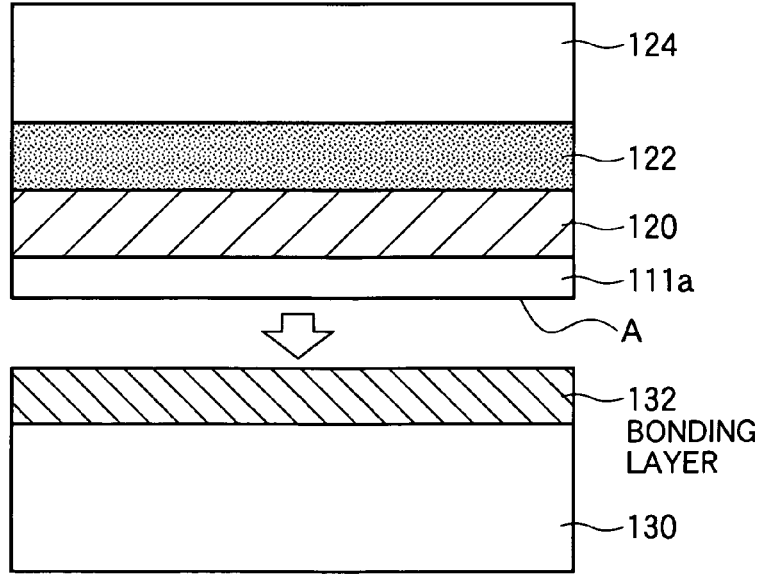

FIG.5A
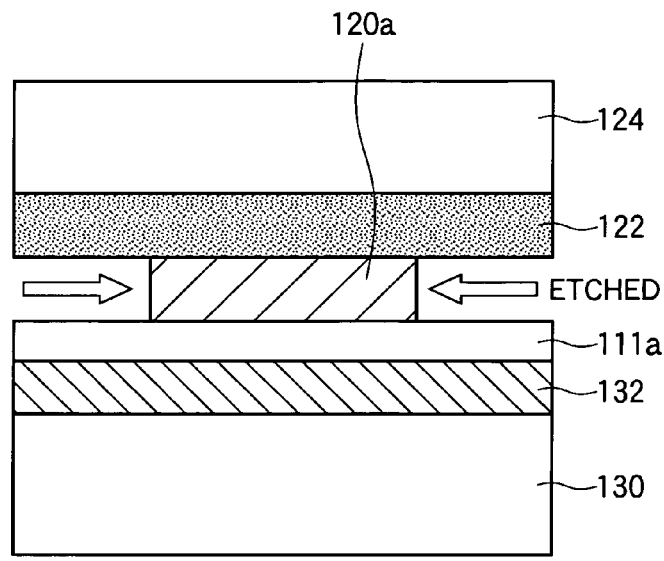
ETCHED
FIG.5B
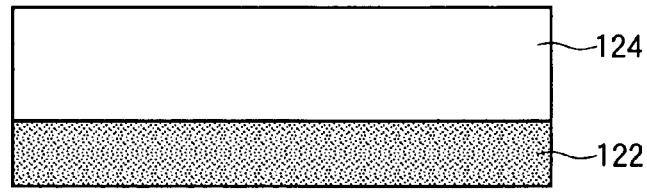
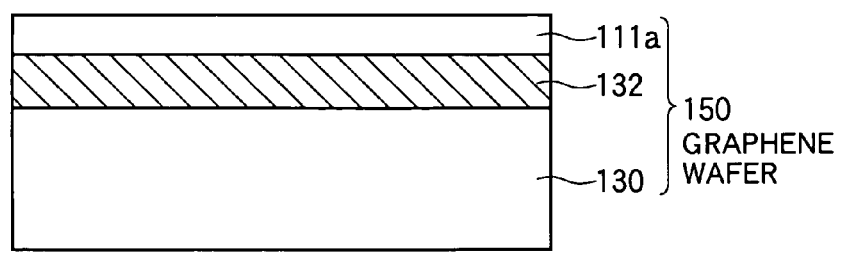

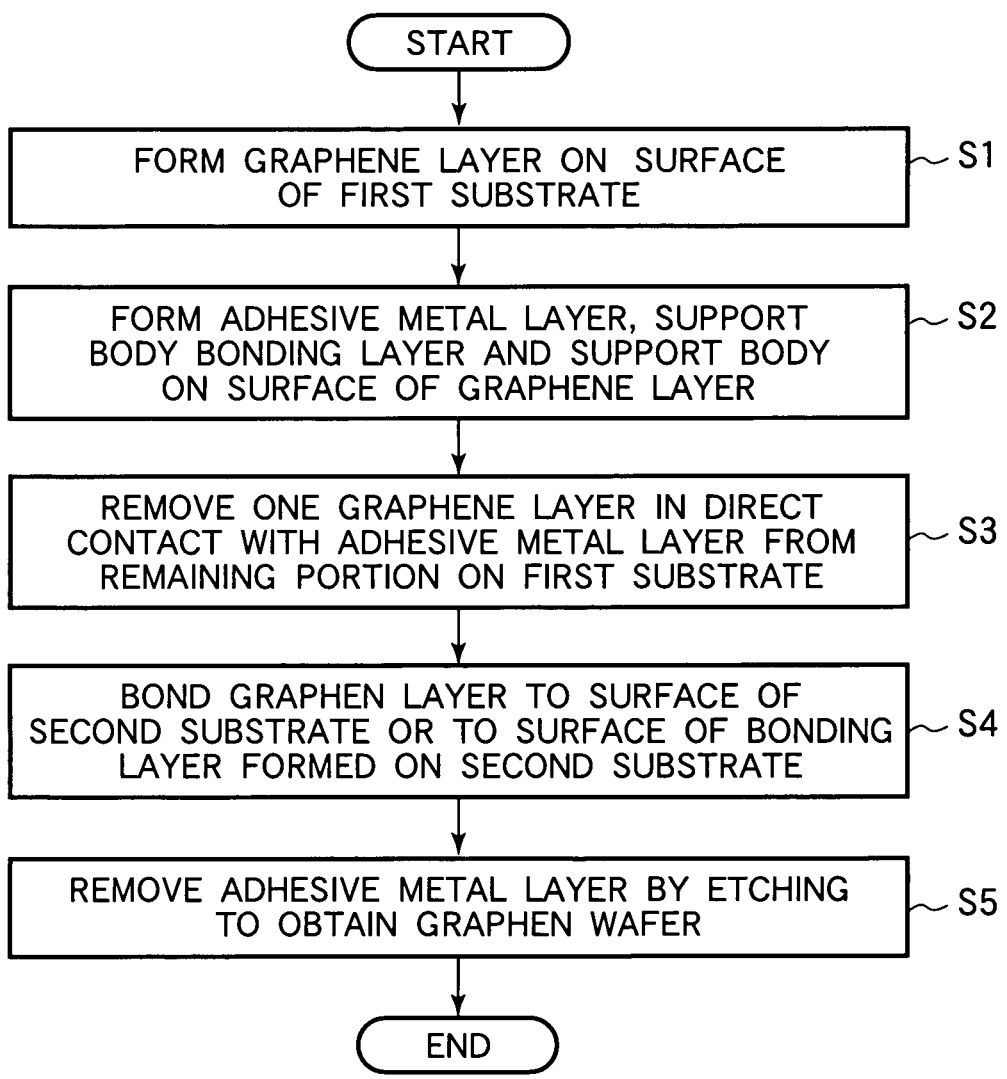

GRAPHENE WAFER, METHOD FOR MANUFACTURING THE GRAPHENE WAFER, METHOD FOR RELEASING A GRAPHENE LAYER, AND METHOD FOR MANUFACTURING A GRAPHENE DEVICE

BACKGROUND OF THE INVENTION

1. Field of the Invention

The present invention relates a graphene wafer, a method for manufacturing a graphene wafer, a method for releasing a graphene layer from a substrate, and a method for manufacturing a graphene device.

2. Description of the Related Art

The Scotch tape method as a transfer technique of graphene was reported in 2004 by A. Gaim et al. of Manchester University in United Kingdom. They succeeded in mechanically transferring a single layer of graphene onto an $SiO_2$/Si substrate from a highly oriented pyrolytic graphite (HOPG).

Graphene is a massless Dirac fermion material having a unique band structure and provides almost all useful electrical properties of carbon nanotubes having a structure of a tube including ballistic conduction, which will attracts engineer interest. Graphene is a new material having a sheet-like structure as opposed to carbon nanotubes (CNT), and therefore lends itself to micromachining used in conventional LSI technology, facilitating the integration of circuits.

After the discovery of graphene, releasing a sheet of graphene from an HOPG is apparently the only way of obtaining a high quality graphene sheet. Thus, a graphene sheet having a large area is difficult to obtain, which is an obstacle to the process for manufacturing integrated devices.

Japanese Patent Application Laid-Open No. 2009-62247 discloses a technique in which an SiC substrate is subjected to high temperature hydrogen etching and high temperature heat treatment in vacuum so as to manufacture and transfer a sheet-like epitaxial graphene (i.e., graphene sheet) layer on the SiC substrate.

An epitaxial graphene layer formed on an SiC substrate has a crystal surface which is flat at the atomic level and is chemically firmly bound, so that chemical adhesion techniques which use a variety of conventional adhesives fail to release the epitaxial graphene layer in its entirety from the entire surface of the SiC substrate. Consequently, this epitaxial graphene layer is difficult to transfer in its entirety onto another substrate.

SUMMARY OF THE INVENTION

The present invention was made to solve the aforementioned drawbacks.

An object of the invention is to provide a graphene wafer, a method for manufacturing a graphene wafer, a method for releasing a graphene layer and then transferring an epitaxial graphene layer onto another substrate with good repeatability, and a method for manufacturing a graphene device.

A method is used for releasing a graphene layer from a substrate. A graphene layer is first formed on a surface of a first substrate. A metal layer is then formed on a surface of the graphene layer. A pulling force is then applied to the metal layer to detach the graphene layer from the first substrate. The released graphene layer is bonded by intermolecular force onto a surface of a second substrate separate from the first substrate or onto a surface of a bonding layer formed on the surface of the second substrate. The metal layer is then removed, by for example, etching.

A method is used for manufacturing a graphene wafer. The method includes:

forming a graphene layer on a surface of a first substrate;

forming a metal layer on a surface of the graphene layer; and applying a pulling force on the metal layer to detach the graphene layer from the first substrate;

bonding, by intermolecular force, the released graphene layer onto a surface of a second substrate separate from the first substrate or onto a surface of a bonding layer formed on the surface of the second substrate; and removing the metal layer.

A method is used for releasing a graphene layer. The method includes:

forming a graphene layer on a surface of a first substrate (101);

patterning the graphene layer;

forming a metal layer on a surface of the patterned graphene layer; and applying a pulling force on the metal layer to detach the graphene layer from the first substrate.

A method is used for manufacturing a graphene wafer. The method includes:

forming a graphene layer on a surface of a first substrate;

patterning the graphene layer;

forming a metal layer on a surface of the patterned graphene layer;

applying a pulling force on the metal layer to detach the graphene layer from the first substrate;

bonding, by intermolecular force, the graphene layer detached from the first substrate onto a surface of a second substrate separate or onto a surface of a bonding layer formed on the surface of the second substrate; and removing the metal layer.

A graphene wafer includes a single layer structure of graphene or a multilayer structure of graphene bonded to a first substrate, the single layer structure of graphene and the multilayer structure of graphene being released from a second substrate different from the first substrate.

A method is used for manufacturing a graphene device. The method includes:

forming a graphene layer on a surface of a first substrate;

forming a metal layer on a surface of the graphene layer;

applying a pulling force on the metal layer to release the graphene layer from the first substrate;

bonding the released graphene layer onto a surface of a second substrate or a surface of a bonding layer formed on the second substrate;

removing the metal layer;

patterning the graphene layer; and forming an electrode on a surface of the patterned graphene layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 3A is a cross-sectional view illustrating a process for releasing the graphene of the first embodiment;

FIG. 3B is a cross-sectional view illustrating another process for releasing the graphene of the first embodiment;

FIG. 4A is a cross-sectional view illustrating a process for bonding the graphene layer onto the second substrate;

FIG. 4B is a cross-sectional view illustrating another process for bonding the graphene layer onto the second substrate;

FIG. 5A is a cross-sectional view illustrating a process for removing the adhesive metal layer;

FIG. 5B is a cross-sectional view illustrating a process for obtaining a graphene wafer;

FIG. 6 is a flowchart illustrating the major portion of the manufacturing process of the graphene wafer;

DETAILED DESCRIPTION OF THE INVENTION

Figure 1A:
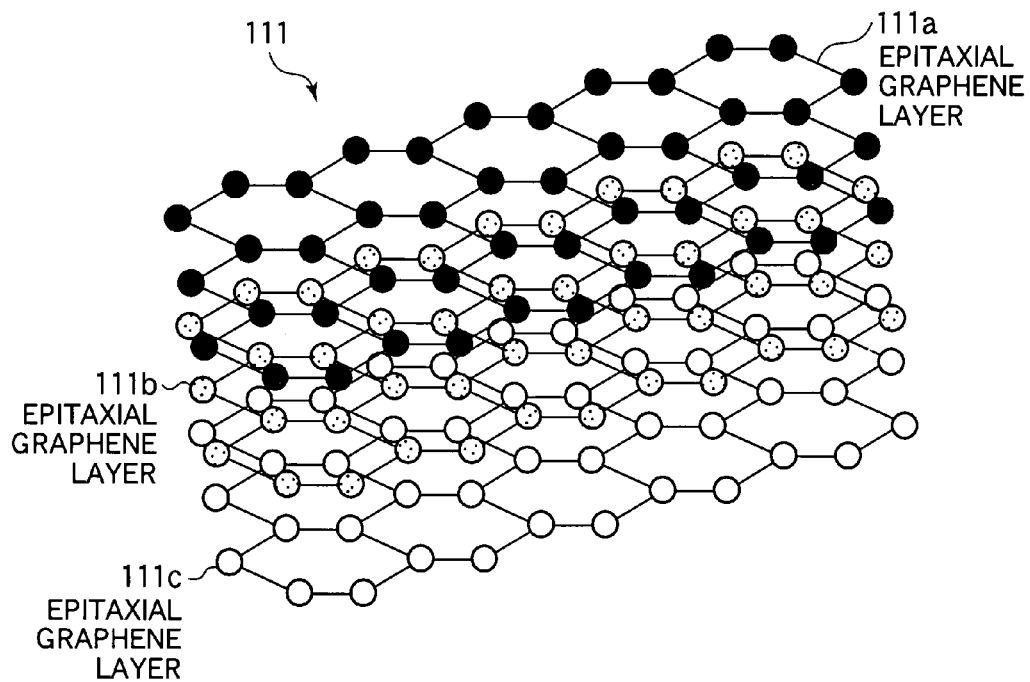
FIG. 1A is a conceptual representation of a three-layer structure of an epitaxial graphene layer (solid circle), an epitaxial graphene layer (polka dot pattern circle), and an epitaxial graphene layer (white circle).

Embodiments of the invention will be described with reference to FIGS. 1-13. FIGS. 1-13 are intended to clearly illustrate features of the invention, and the dimensional relationships may be exaggerated slightly. Elements common to the respective drawings have been given the same reference numerals.

First Embodiment

Figure 1B:
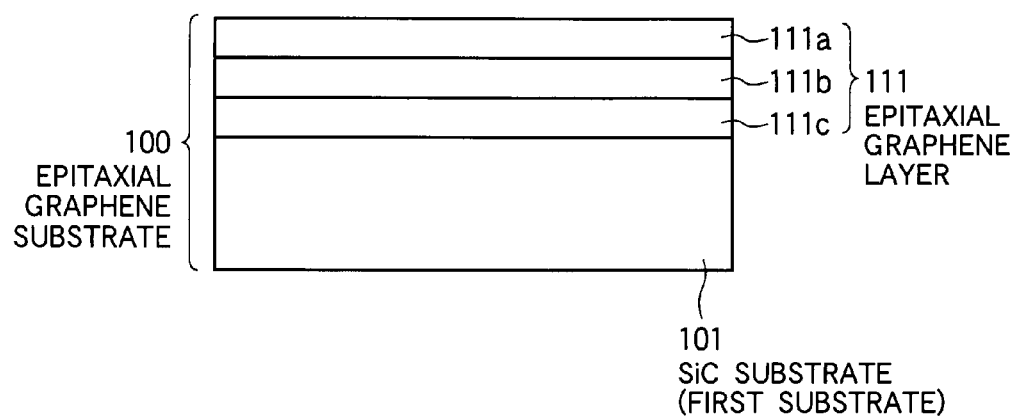
FIG. 1B is a cross-sectional view of the epitaxial graphene substrate on which the epitaxial graphene layer is formed.

A first embodiment will be described with reference to FIGS. 1A, 1B, 2, 3A, 3B, 4A, 4B, 5A, 5B, 6, 7A, and 7B. FIGS. 1A and 1B illustrate an epitaxial graphene substrate 100. The epitaxial graphene substrate 100 includes an SiC substrate 101 and an epitaxial graphene layer 111.

The configuration of the epitaxial graphene layer 111 will be described with reference to FIG. 1A. The epitaxial graphene layer 111 is a flat monolayer of carbon atoms C (solid circles, polka dot pattern circles, and white circles in FIG. 1A) tightly packed into a two-dimensional (2D) honeycomb lattice or a multilayer structure of sheets of the flat monolayer. FIG. 1A is a conceptual representation of a three-layer structure of an epitaxial graphene layer 111a (solid circle), an epitaxial graphene layer 111b (polka dot pattern circle), and an epitaxial graphene layer 111c (white circle). An SiC substrate 101 is subjected to high temperature hydrogen etching and high temperature heat treatment in vacuum, thereby manufacturing a sheet-like epitaxial graphene (graphene sheet) layer on the SiC substrate 101 as a first substrate.

FIG. 1B is a cross-sectional view of the epitaxial graphene substrate 100 on which the epitaxial graphene layer 111 is formed. The epitaxial graphene layer 111 is formed by high temperature hydrogen etching and high temperature heat treatment in vacuum. The epitaxial graphene layer 111a, epitaxial graphene layer 111b, and epitaxial graphene layer 111c are formed in this order on the SiC substrate 101.

Figure 2:
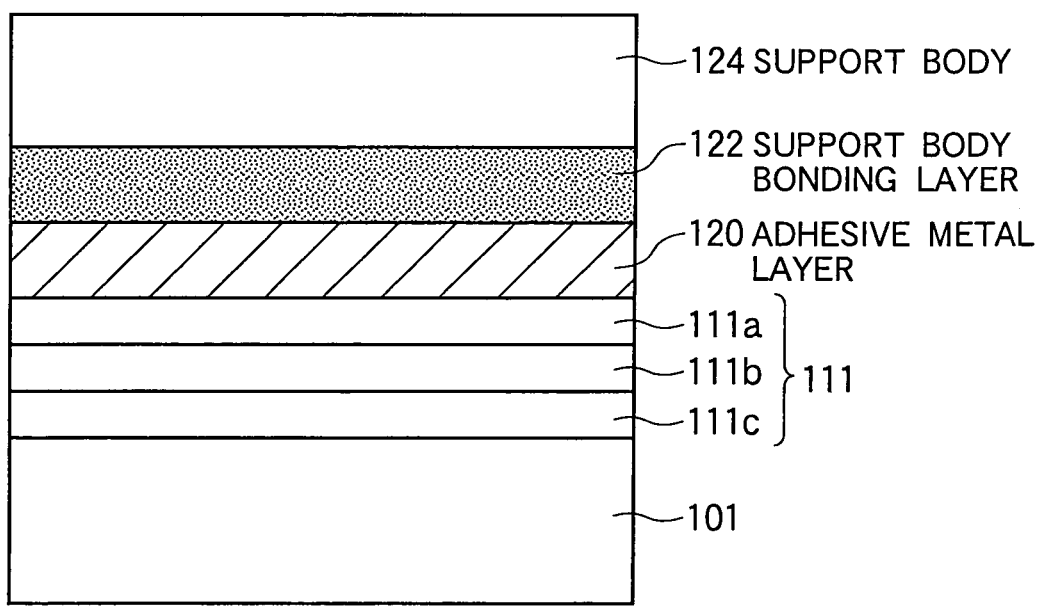
FIG. 2 is a cross-sectional view illustrating a graphene wafer of a first embodiment.

FIGS. 2 to 3 are cross-sectional views illustrating a method for releasing the epitaxial graphene layer (referred to graphene layer hereinafter) 111a of monolayer from the epitaxial graphene layer 111 formed on the SiC substrate 101.

Referring to FIG. 2, one of the features of the invention is to form an adhesive metal layer 120, a support body bonding layer 122, and a support body 124 in this order on the surface of the graphene layer 111a which is a top layer of the graphene layer 111.

As previously described, the graphene layer 111 includes layers stacked one on top of the other, each layer being flat at the atomic level and chemically firmly bound, so that use of chemical adhesion techniques, which employ a variety of conventional adhesives, fails to release a sheet of graphene layer in its entirety from the other. The first embodiment employs an adhesive metal layer 120 formed on the surface of the graphene layer 111a so that the material for the adhesive metal layer 120 may diffuse into the graphene layer 111a.

The adhesive metal layer 120 is conveniently a metal layer that contains a metal selected from the group consisting of Ti, Ni, Al, Cu, Cr, In, and Pd, and may be formed by vacuum CVD or sputtering. The adhesive metal layer 120 preferably covers at least the entire surface of the graphene layer 111a that should be detached or released. This is because only the graphene layer 111a having a large area is to be detached. Therefore, the adhesive metal layer 120 needs to have a sufficient thickness and cover at least the entire surface of the graphene layer.

The surface of the support body bonding layer 122 can be in highly intimate contact with the adhesive metal layer 120. The adhesion between the support body bonding layer 122 and the adhesive metal layer 120 is preferably larger than the intermolecular forces acting between the graphene layer 111a and the graphene layer 111b, and between the graphene layer 111b, and the graphene layer 111c. The support body bonding layer 122 preferably covers the entire surface of the adhesive metal layer 120, and is preferably formed of an adhesive material, for example, an epoxy adhesive, a urethane resin adhesive, a phenol resin adhesive, a polyimide adhesive, a thermosetting adhesive, a UV curing adhesive, an organic coating material, and a solder material.

The surface of the adhesive metal layer 120 has ridges and furrows therein such that the adhesive material fills small spaces between the ridges and furrows to develop an anchoring effect, providing excellent adhesion. The support body bonding layer 122 may be formed by, for example, doctor blade coating, spin coating, spray coating, or dispensing depending on the adhesive material.

Then, the support body 124 is bonded to the surface of the support body bonding layer 122. The support body 124 supports the detached graphene layer 111*a* thereon and the adhesion between the support body bonding layer 122 and the support body 124 is larger than the bonding strength between adjacent layers of the graphene layer 111. The support body 124 may take the form of a glass substrate, a ceramic substrate, a quartz substrate, or a semiconductor substrate such as Si.

As described later, the detached graphene layer 111*a* is bonded to another substrate (i.e., second substrate). The structure is then placed in an etching solution, for example, an acid or a basic chemical solution so that the adhesive metal layer 120 is etched away, thereby separating the support body bonding layer 122 and the support body 124 from the graphene layer 111*a*. The support body 124 is preferably sufficiently resistant to the etching solution so that the support body 124 can be re-used.

As shown in FIG. 3A, the support body 124 is lifted or pulled from the remaining portion of the structure with a force F larger than the intermolecular force acting between the layers 111*a*, 111*b*, and 111*c* of the graphene 111, thereby separating the graphene layer 111*a* from the graphene layer 111*b*. This facilitates detachment of the graphene layer 111*a* having a large area from the SiC substrate. For example, the support body 124 may be lifted or pulled by vacuum suction as shown in FIG. 3B.

FIG. 4A is a cross-sectional view illustrating a process for bonding the graphene layer onto the second substrate.

FIG. 4B is a cross-sectional view illustrating another process for bonding the graphene layer onto the second substrate.

The release surface A of the graphene layer 111*a* is bonded to the surface of another substrate (i.e., second substrate) 130 in intimate contact as shown in FIG. 4A. The bonding is achieved by the intermolecular force acting between the surface of the second substrate 130 and the release surface of the graphene layer 111*a*. Alternatively, a bonding layer 132 may be formed on the second substrate 130 and the release surface A of the graphene layer 111*a* may be bonded to the bonding layer 132 by intermolecular force.

In order for the surfaces to be bonded to each other by intermolecular force, the graphene layer 111*a* and the second substrate 130 have preferably flat surfaces having a surface roughness at least on the order of nanometers.

Flatness on the order of nanometers implies a surface roughness (maximum difference between a peak and a valley: Rrv) less than 10 nanometers when measured with an atomic force microscope (AFM). More preferably, the second substrate 130 has a Value of Rrv equal to or smaller than 3 nm.

The second substrate 130 may be a semiconductor substrate such as Si substrate or an AlN substrate, a ceramic substrate, a glass substrate, a quartz substrate, a plastic substrate, or a metal substrate. The bonding layer 132 may be a thin film of, for example, $SiO_2$, SiN, SiON, PSG, BSG, or SOG, and may be formed on the second substrate by plasma CVD, CVD, or sputtering.

As describe above, the graphene layer 111*a* is bonded directly onto the surface of the second substrate 130 or onto the bonding layer 132 formed on the second substrate 130.

FIG. 5A is a cross-sectional view illustrating a process for removing the adhesive metal layer 120.

FIG. 5B is a cross-sectional view illustrating a process for obtaining a graphene wafer.

The adhesive metal layer 120 is then removed as shown in FIGS. 5A and 5B. For example, the adhesive metal layer 120 may be chemically etched away using an acid or a basic etching solution. When the adhesive metal layer 120 is chemically etched away, the etching solution should be such that the adhesive metal layer 120 is easily etched but the bonding layer 132 can not be etched easily.

The above-described process provides a graphene wafer 150 having the graphene layer 111*a* bonded directly onto the surface of the second substrate 130 or onto the surface of the bonding layer 132 formed on the second substrate 130.

FIG. 6 is a flowchart illustrating the major portion of the manufacturing process of the graphene wafer 150.

Step S1: A graphene layer is formed on the surface of a first substrate (FIG. 1B).

Step S2: An adhesive metal layer 120, support body bonding layer 122, support body 124 are formed on the surface of the graphene layer (FIG. 2).

Step S3: One graphene layer in direct contact with the adhesive metal layer 120 is removed from the remaining portion on the first substrate (FIGS. 3A-3B).

Step S4: The graphene layer is then bonded to the surface of the second substrate or to the surface of the bonding layer formed on the second substrate (FIG. 4A).

Step S5: The adhesive metal layer 120 is removed by etching to obtain a graphene wafer (FIG. 5A).

Figure 7A:
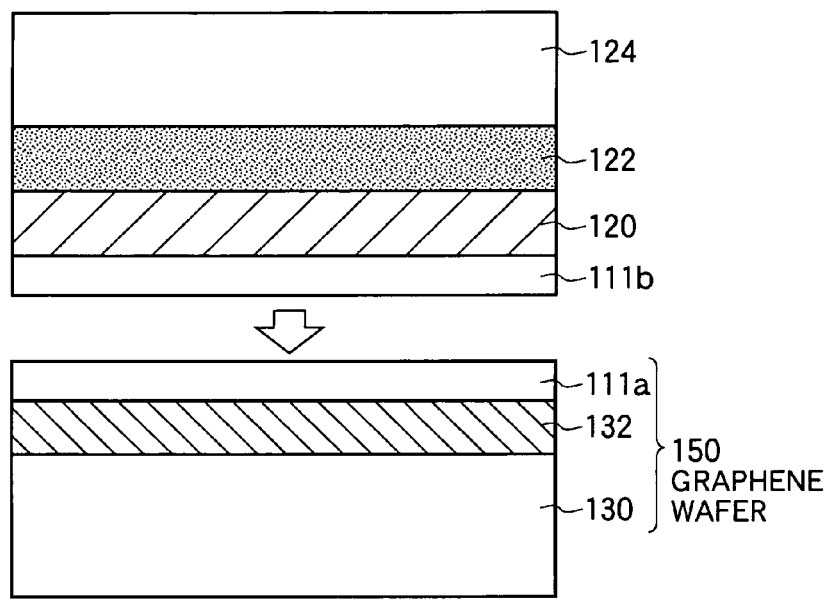
FIG. 7A is a cross-sectional view illustrating a process for bonding the graphene onto the second substrate.

FIG. 7A is a cross-sectional view illustrating a process for bonding the graphene onto the second substrate.

Figure 7B:
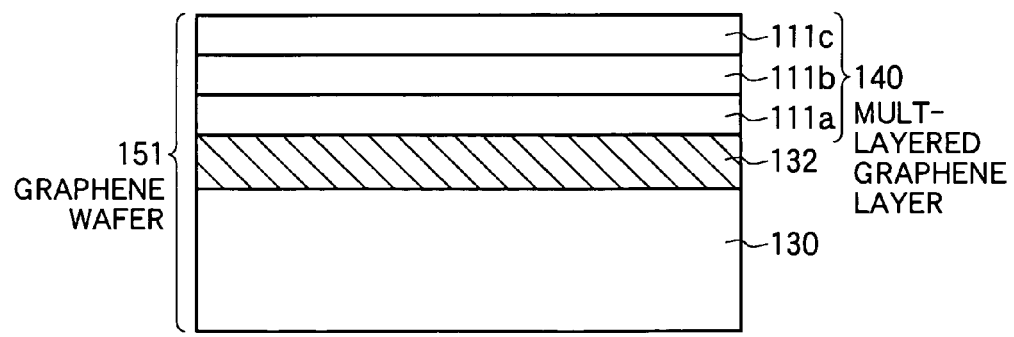
FIG. 7B is a cross-sectional view of a graphene wafer having a multi-layered graphene layer.

FIG. 7B is a cross-sectional view of a graphene wafer having a multi-layered graphene layer 140.

Referring to FIGS. 7A and 7B, the graphene layer 111*b* may further be bonded onto the graphene layer 111*a* that has been bonded onto the surface of the second substrate 130 or onto the surface of the bonding layer 132 formed on the second substrate 130.

Likewise, a graphene wafer 151 can be obtained in which a multi-layered graphene layer 140 consisting of the graphene layers 111*a*, 111*b*, and 111*c* is formed on the surface of the second substrate 130 or on the bonding layer 132 formed on the substrate 130.

As described above, the first embodiment employs steps of:

forming the adhesive metal layer 120 on the entire surface of the graphene layer 111*a* formed on the surface of the first substrate (SiC substrate) 101, the adhesive metal layer being formed of a metal material easy to diffuse into the graphene layer 111*a*; and forming the support body 124 and the support body bonding layer 122 that has an excellent bonding property between the adhesive metal layer 120 and the support body bonding layer 122;

lifting or pulling the support body 124 from the remaining structure, thereby releasing the graphene layer 111*a* from the first substrate (SiC substrate) 101. Further, the following steps are also performed:

bonding, by means of intermolecular force, the detected graphene layer 111*a* onto the surface of another substrate (i.e., second substrate) 130 or the bonding layer 132 formed on the second substrate 130; and removing only the adhesive metal layer 120 by chemical etching.

This method allows manufacturing of the large-area graphene wafer 150 bonded onto the surface of the second substrate. Also, the graphene wafer 151 having a large area with a multi-layered graphene layer 140 can be manufactured.

{Modification}

While the first embodiment has been described in terms of the graphene layer 111 formed on the first substrate 101 (SiC substrate), the first substrate is not limited to an SiC substrate but may also be a substrate formed of another material, e.g., an SiC substrate on which an SiC thin film is formed.

Second Embodiment

The first embodiment is directed to manufacturing a single large-area graphene wafer in which the large-area graphene layer 111a is bonded to the surface of the second substrate 130 or the surface of the bonding layer 132 formed on the second substrate 130. In contrast, a second embodiment is directed to bonding a pre-patterned graphene layer onto a substrate. The second embodiment will be described with respect to FIGS. 8 to 10.

Figure 8A:
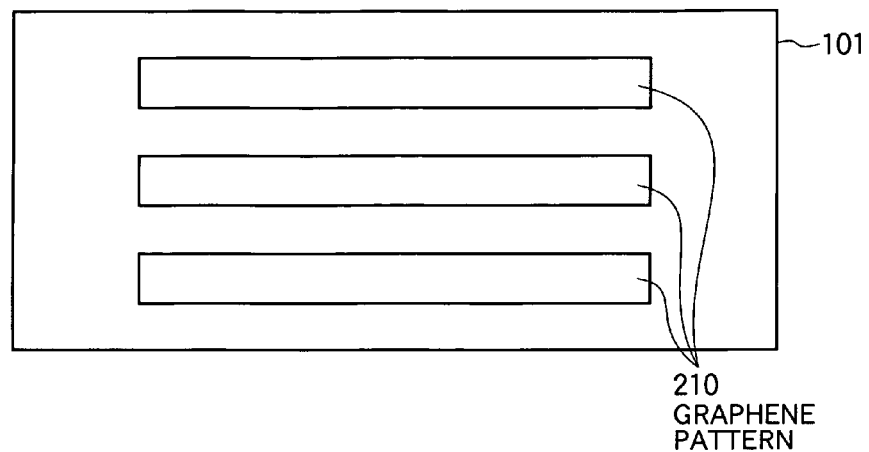
FIG. 8A is a top view illustrating a graphene pattern.

FIG. 8A is a top view illustrating a graphene pattern.

Figure 8B:
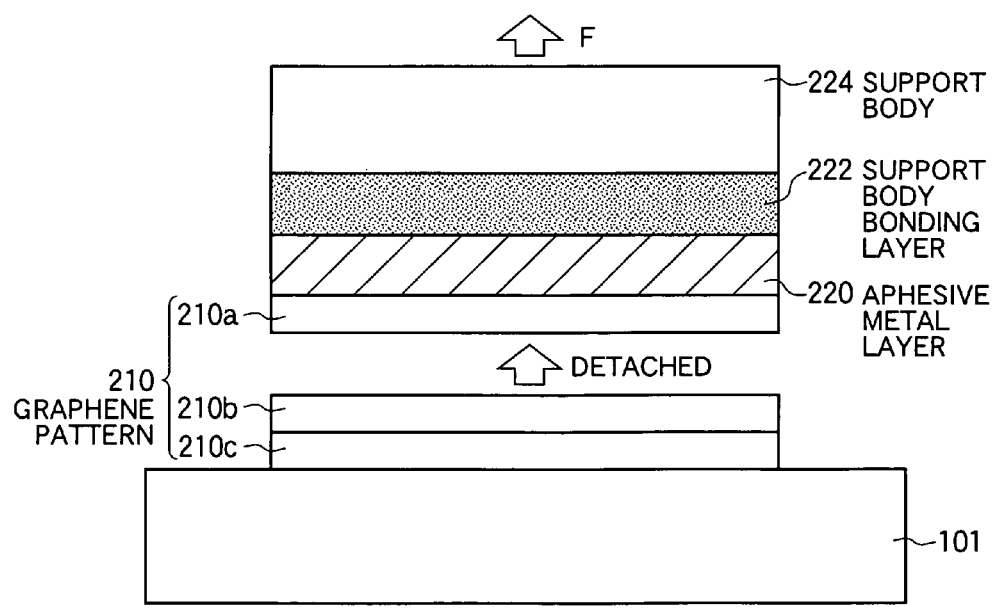
FIG. 8B is a cross sectional view illustrating a process for releasing a graphene.

FIG. 8B is a cross sectional view illustrating a process for releasing a graphene.

Referring to FIG. 8A, a graphene layer 111 (not shown) is formed on the surface of an SiC substrate 101 (first substrate) and is patterned by photolithography and then dry-etching using $O_2$ plasma, thereby forming a graphene pattern 210. The graphene pattern 210 in a line pattern shown in FIG. 8A is exemplary and the graphene pattern 210 having any shape is possible.

Referring to FIG. 8B, the graphene layer 111 that includes a graphene layer 111a, a graphene layer 111b, and a graphene layer 111c is patterned to form a graphene pattern 210 that includes a graphene pattern 210a, a graphene pattern 210b, and a graphene pattern 210c. An adhesive metal layer 220, support body bonding layer 222, and support body 224 are then formed in this order on the graphene pattern 210a which is the uppermost graphene pattern of the graphene pattern 210. The support body 224 is lifted or pulled from the remaining structure to detach the graphene pattern 210a from the SiC substrate 101.

The manufacturing method has been described which includes patterning of the graphene layer 111 formed on the SiC substrate (first substrate) 101 to form the graphene pattern 210 and then detaching the graphene pattern 210a. The patterning of the graphene layer 111 may be performed as follows: The adhesive metal layer 220, support body bonding layer 222, support body 224, and the graphene layer 111 are patterned simultaneously to thereby form the graphene pattern 210.

In any case, the adhesive metal layer 220 is basically formed on the surface of the graphene layer 111, and a variety of modifications may be made to the patterning of the graphene layer 111 and formation of the support body 224.

Figure 9:
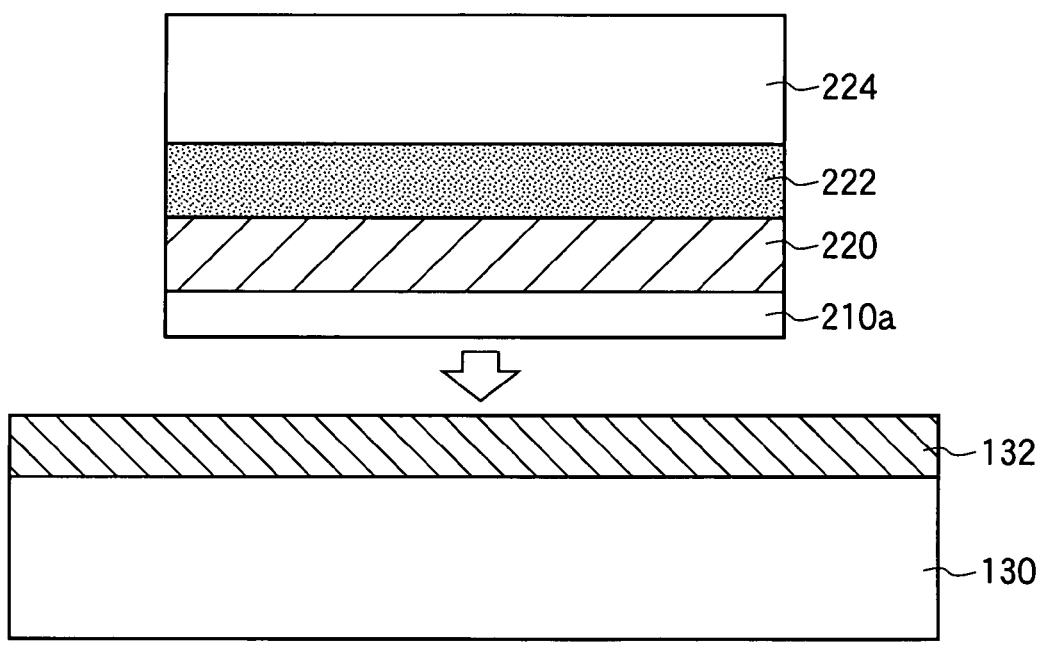
FIG. 9 is a cross-sectional view illustrating a manufacturing process of a graphene wafer of the second embodiment.

FIG. 9 is a cross-sectional view illustrating a manufacturing process of a graphene wafer of the second embodiment.

Figure 10A:
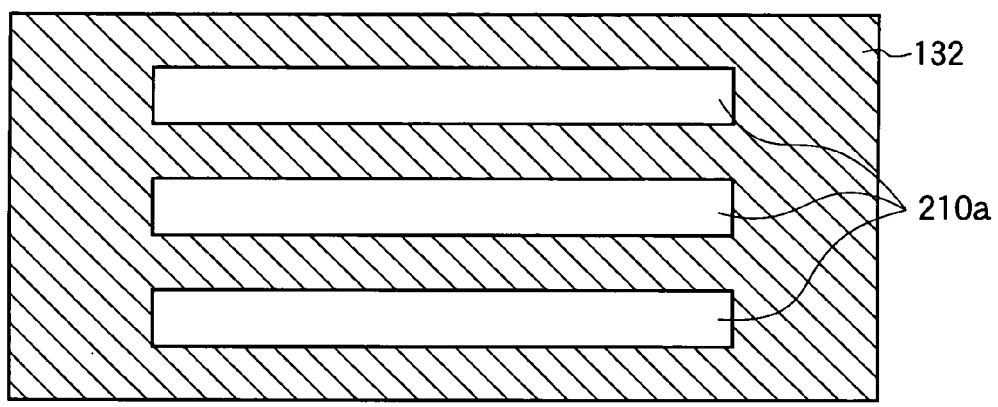
FIG. 10A is a top view of the graphene wafer of the second embodiment.

FIG. 10A is a top view of the graphene wafer of the second embodiment.

Figure 10B:
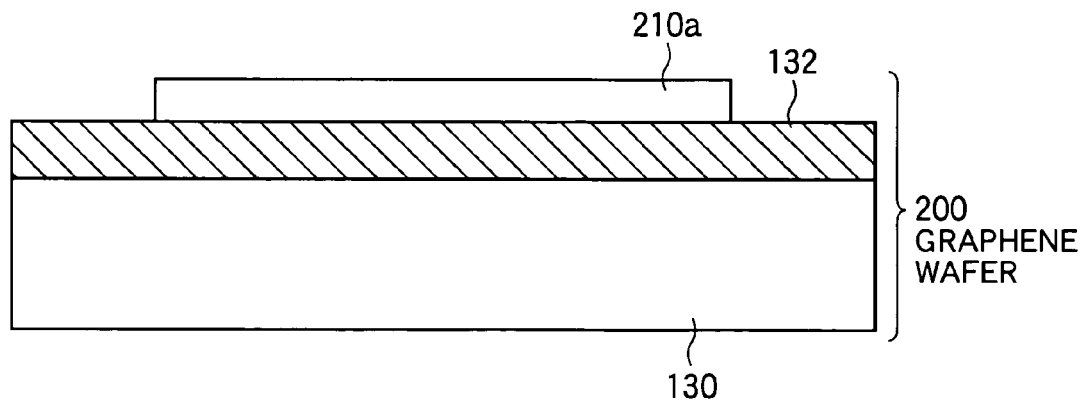
FIG. 10B is a cross-sectional view of the graphene wafer of FIG. 10A.

FIG. 10B is a cross-sectional view of the graphene wafer of FIG. 10A.

Referring to FIG. 9, just as in the first embodiment, the graphene pattern 210a is bonded by intermolecular force onto the surface of the second substrate 130 or the surface of the bonding layer 132 formed on the second substrate 130.

Just as the detaching process or releasing process of the first embodiment described with reference to FIG. 5, only the adhesive metal layer 220 is removed by etching, thereby separating the support body bonding layer 222 and the support body 224 from the remaining structure. Etching away the adhesive metal layer 220 provides a graphene wafer 200 having the graphene pattern 210a bonded to the bonding layer 132 formed on the surface of the second substrate 130.

As described above, the second embodiment employs steps of:

forming the adhesive metal layer 220, the support body bonding layer 222, and support body 224 in this order on the surface of the graphene pattern 210a;

detaching the graphene pattern 210a from the surface of the first substrate 101; and bonding the graphene pattern 210a onto the surface of the second substrate 130 or the surface of the bonding layer 132 formed on the second substrate 130.

This method allows easy forming of a graphene pattern of a desired shape on the surface of the second substrate 130 or the surface of the bonding layer 132 formed on the second substrate 130.

Graphene has a current carrying capacity about two orders of magnitude higher than copper. Therefore, patterning may be performed to form, for example, a graphene pattern that includes highly-packed graphene wiring electrodes capable of high current density.

Third Embodiment

A third embodiment is directed to a method of manufacturing a graphene device using a large-area graphene wafer described in the first embodiment. The third embodiment will be described with reference to FIGS. 11-13.

In the description below, a graphene thin film transistor (TFT) will be used as an exemplary graphene device based on a large-area graphene wafer.

Figure 11A:
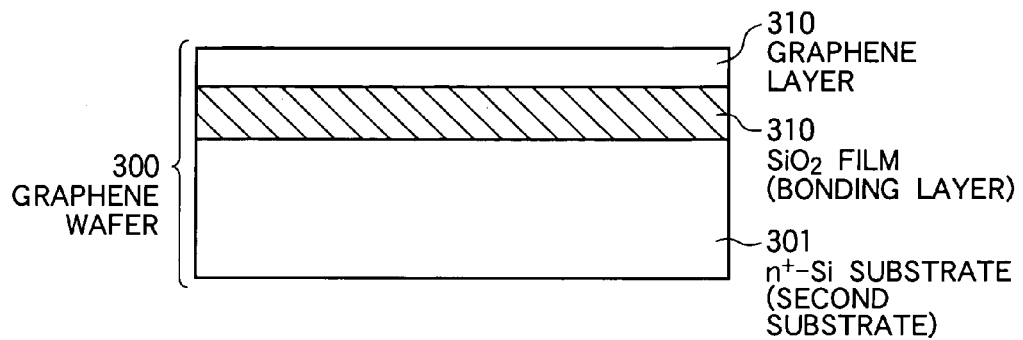
FIG. 11A illustrates a graphene wafer having a large-area graphene layer formed thereon.

FIG. 11A illustrates a graphene wafer 300 having a large-area graphene layer formed thereon. The graphene wafer 300 includes an $SiO_2$ film 302 as a bonding layer formed on an n+-SiC substrate 301 and a graphene layer 310 bonded by intermolecular force onto the surface of the $SiO_2$ film 302. The $SiO_2$ film 302 may take the form of a thermally-oxidized film.

Figure 11B:
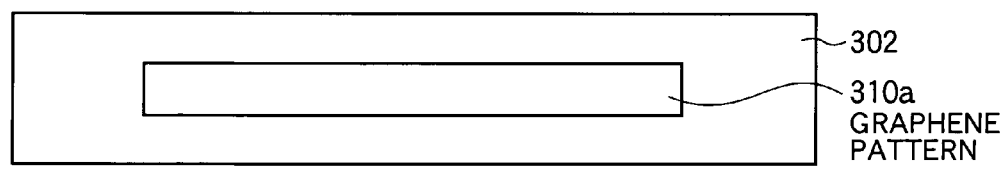
FIG. 11B is a cross-sectional view of the graphene wafer.
Figure 11C:
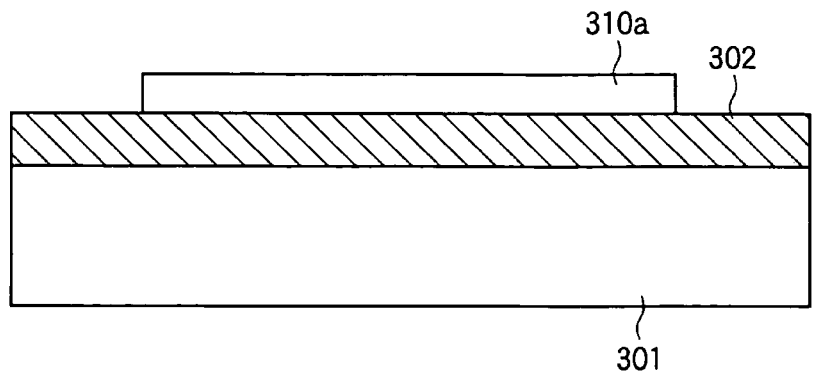
FIG. 11C is a top view of a graphene wafer.

FIG. 11B is a cross-sectional view of the graphene wafer and FIG. 11C is a top view of a graphene wafer. Referring to FIG. 11B and FIG. 11C, a step of photolithography and a step of dry-etching using $O_2$ plasma are performed to pattern the graphene layer 310, thereby forming a graphene pattern 310a.

Figure 12A:
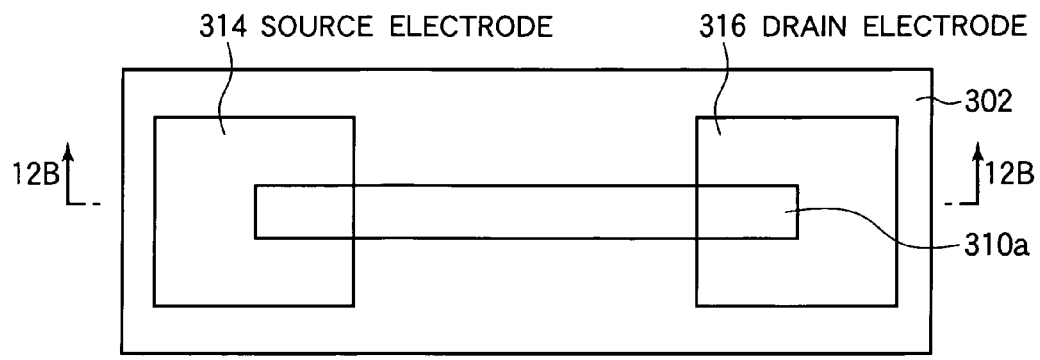
FIG. 12A is a top view of a graphene device illustrating a source electrode and a drain electrode.
Figure 12B:
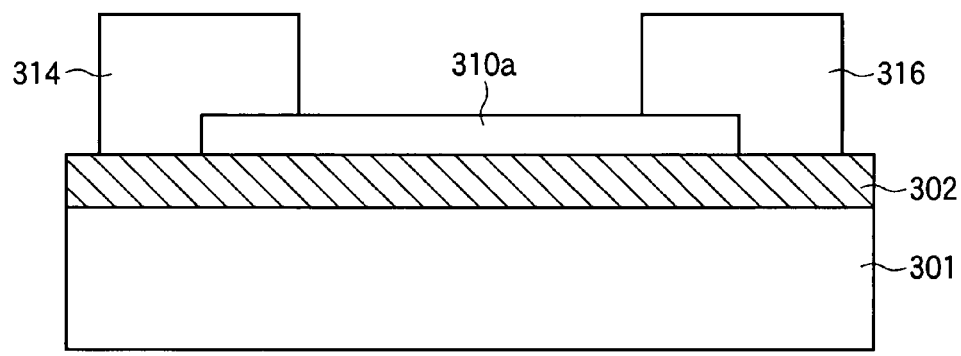
FIG. 12B is a cross-sectional view taken along a line 12B-12B in FIG. 12A.
Figure 12C:
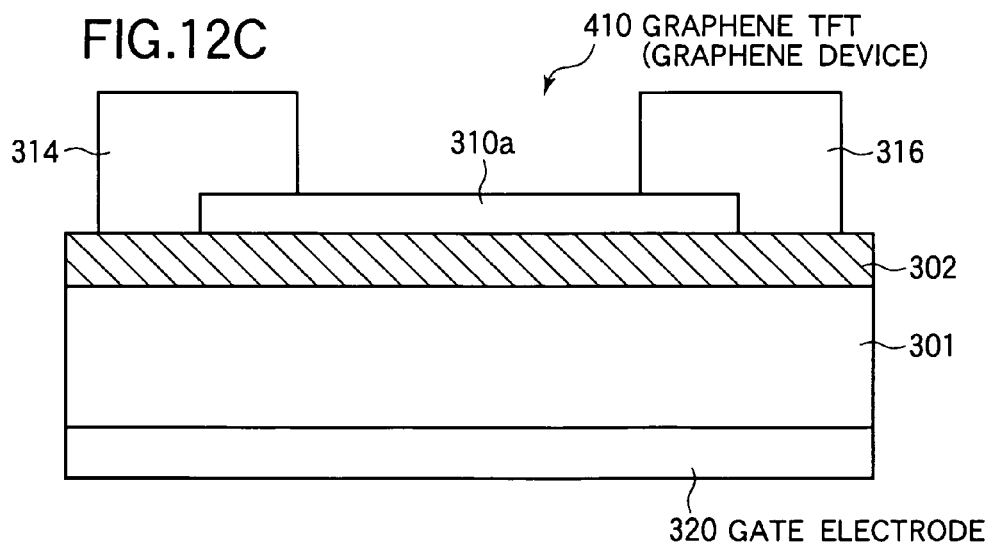
FIG. 12C is a cross-sectional view of a gate electrode.

FIG. 12A is a top view of a graphene device illustrating a source electrode 314 and a drain electrode 316 and FIG. 12B is a cross-sectional view taken along a line 12B-12B in FIG. 12A. FIG. 12C is a cross-sectional view of a gate electrode. Referring to FIGS. 12A and 12B, a step of photolithography in which devices are formed by known techniques, i.e., a step of forming a metal thin film and a step of lifting off or pulling of the metal thin film, are performed to form the source electrode 314 and the drain electrode 316.

Referring to FIG. 12C, a gate electrode 320 is then formed on the back surface of the n+-Si substrate 301, thereby obtaining a bottom gate graphene TFT 400.

As described above, the third embodiment has been described in terms of the bottom gate graphene TFT 400.

Figure 13:
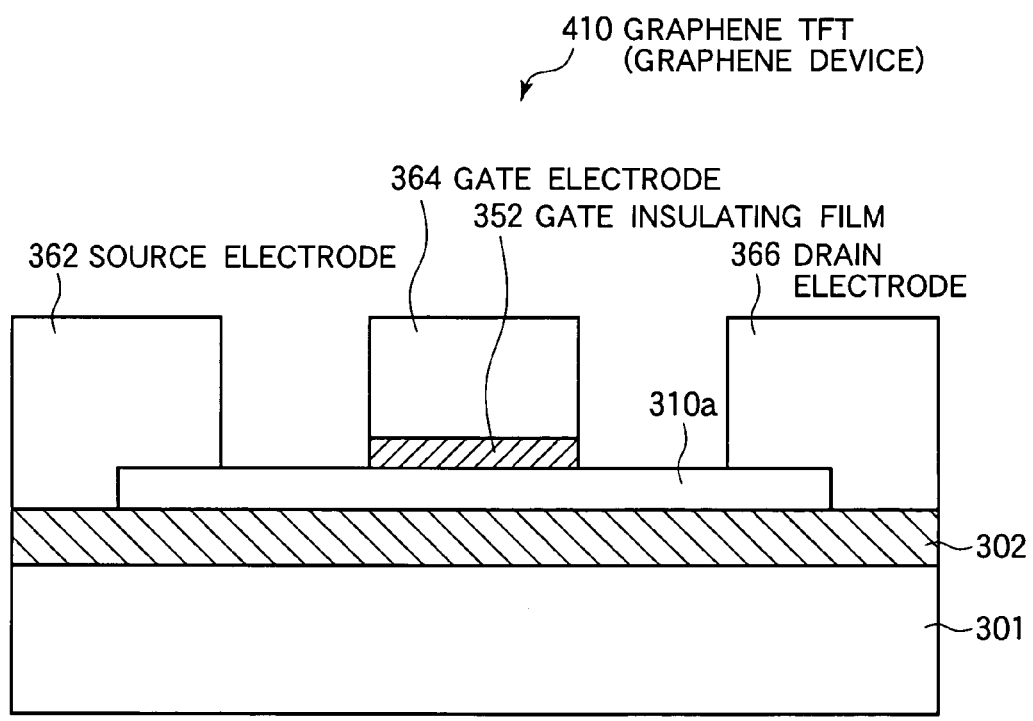
FIG. 13 illustrates a modification to the third embodiment.

FIG. 13 illustrates a modification to the third embodiment. A gate insulating film 352 is formed on the surface of the patterned graphene layer 310a, and further the source electrode 362, the gate electrode 364, and a drain electrode 366, thereby obtaining a top gate graphene TFT 410. In this case, the n+-Si substrate 301 need not be used for forming a TFT structure but a general purpose Si substrate having a normal carrier concentration may be used.

As described above, the third embodiment performs patterning on a large-area graphene wafer using a standard Si-LSI manufacturing techniques (e.g., photolithography, etching, insulating film formation, electrodes and wiring forming processes), thereby forming a graphene layer on a large-area graphene wafer into a predetermined size and shape to form electrodes. Thus, the graphene devices can be manufactured according to a device design without difficulty. In addition, the large-area graphene wafer of the invention can be used to integrate graphene devices.

As described above, the graphene wafer, method for manufacturing a graphene wafer, method for releasing a graphene layer, and method for manufacturing a graphene device according to the invention provide almost all electronic characteristics of carbon nanotubes (CNT) that are receiving attention as an electronics material for the next generation.

The present invention enables creating of completely new electronic materials as massless Dirac fermions having features, e.g., remarkably high electron mobility that cannot be found in conventional materials. Graphene devices are expected to eventually replace conventional silicon devices.

What is claimed is:

1. A method for manufacturing a graphene wafer comprising:
   forming a graphene layer on a surface of a first substrate;
   forming a metal layer on a surface of the graphene layer;
   applying a pulling force on the metal layer to release the graphene layer from the first substrate;
   bonding, by intermolecular force, the released graphene layer onto a surface of a second substrate separate from the first substrate, the surface of the second substrate having a surface roughness equal to or less than 3 nm; and
   removing the metal layer.

2. The method according to claim 1, further comprising:
   after forming the metal layer on the graphene layer, forming a support body bonding layer on the metal layer;
   after forming the support body bonding layer on the metal layer, forming a support body on the support body bonding layer; and
   applying a pulling force on the support body to detach the graphene layer from the first substrate.

3. The method according to claim 1, wherein the first substrate is one of an SiC substrate and an Si substrate, wherein when the first substrate is an Si substrate, an SiC thin film is formed on the Si substrate.

4. The method according to claim 1, the metal layer contains one or more elements selected from the group consisting of Ti, Ni, Al, Cu, Cr, In and Pd.

5. The method according to claim 1, further comprising pattering the graphene layer after forming the graphene layer on the surface of the first substrate.

6. The method according to claim 1, wherein the surface roughness is expressed in terms of a maximum difference between a peak of the second substrate and a valley of the second substrate when measured with an atomic force microscope (AFM).

7. A method for manufacturing a graphene device, comprising:
   forming a graphene layer on a surface of a first substrate;
   forming a metal layer on a surface of the graphene layer;
   applying a pulling force on the metal layer to release the graphene layer from the first substrate;
   bonding the released graphene layer onto a surface of a second substrate, the surface of the second substrate having a surface roughness equal to or less than 3 nm;
   removing the metal layer;
   patterning the graphene layer; and
   forming an electrode on a surface of the patterned graphene layer.

8. The method according to claim 7, further comprising:
   after forming the metal layer on the graphene layer, forming a support body bonding layer on the metal layer;
   after forming the support body bonding layer on the metal layer, forming a support body on the support body bonding layer; and
   applying a pulling force on the support body to detach the graphene layer from the first substrate.

9. The method according to claim 7, wherein the first substrate is one of an SiC substrate and an Si substrate,
   wherein when the first substrate is an Si substrate, an SiC thin film is formed on the Si substrate.

10. The method according to claim 7, wherein the metal layer contains one or more elements selected from the group consisting of Ti, Ni, Al, Cu, Cr, In and Pd.

11. The method according to claim 7, wherein the surface roughness is expressed in terms of a maximum difference between a peak of the second substrate and a valley of the second substrate when measured with an atomic force microscope (AFM).

* * * * *